(12) United States Patent
Feustel et al.

(10) Patent No.: US 7,705,352 B2
(45) Date of Patent: Apr. 27, 2010

(54) TEST STRUCTURE FOR ESTIMATING ELECTROMIGRATION EFFECTS WITH INCREASED ROBUSTNESS WITH RESPECT TO BARRIER DEFECTS IN VIAS

(75) Inventors: Frank Feustel, Dresden (DE); Kai Frohberg, Niederau (DE); Thomas Werner, Moritzburg (DE)

(73) Assignee: Globalfoundries Inc., Grand Cayman (KY)

( * ) Notice: Subject to any disclaimer, the term of this patent is extended or adjusted under 35 U.S.C. 154(b) by 240 days.

(21) Appl. No.: 11/782,734

(22) Filed: Jul. 25, 2007

(65) Prior Publication Data
US 2008/0157075 A1 Jul. 3, 2008

(30) Foreign Application Priority Data
Dec. 29, 2006 (DE) .................. 10 2006 062 034

(51) Int. Cl.
*H01L 23/52* (2006.01)
(52) U.S. Cl. .................. 257/48; 257/E23.141; 324/766
(58) Field of Classification Search .................. 257/48, 257/E23.141; 324/766
See application file for complete search history.

(56) References Cited

U.S. PATENT DOCUMENTS

| | | | |
|---|---|---|---|
| 6,355,969 B1* | 3/2002 | Skala et al. .................. 257/530 |
| 6,680,484 B1* | 1/2004 | Young .......................... 257/48 |
| 6,714,037 B1* | 3/2004 | Hau-Riege et al. .......... 324/766 |
| 6,762,597 B1* | 7/2004 | Hau-Riege et al. ......... 324/71.1 |
| 6,822,473 B1* | 11/2004 | Hau-Riege et al. .......... 324/766 |
| 2003/0226121 A1* | 12/2003 | Yokogawa ..................... 716/1 |
| 2004/0026693 A1* | 2/2004 | McLaughlin et al. .......... 257/48 |
| 2008/0246030 A1* | 10/2008 | Satya et al. .................... 257/48 |

FOREIGN PATENT DOCUMENTS

DE 197 10 471 A1 5/1998
DE 10 2006 025 365 A1 12/2007

OTHER PUBLICATIONS

Translation of Official Communication from German Patent Office for German Patent Application No. 10 2006 062 034.8-33 dated Mar. 12, 2008.
Translation of Official Communication from German Patent Office for German Patent Application No. 10 2006 062 034.8-33 dated Sep. 6, 2007.

* cited by examiner

*Primary Examiner*—Victor A Mandala
(74) *Attorney, Agent, or Firm*—Williams, Morgan & Amerson, P.C.

(57) ABSTRACT

By providing vias of increased mass flow blocking capability next to respective line segments of an electromigration test structure, the reliability of respective assessments may be enhanced, since electromigration-induced void formation in the test line segment under consideration may be efficiently decoupled from metal diffusion of neighboring test areas of the test structure.

15 Claims, 5 Drawing Sheets

TEST STRUCTURE FOR ESTIMATING ELECTROMIGRATION EFFECTS WITH INCREASED ROBUSTNESS WITH RESPECT TO BARRIER DEFECTS IN VIAS

BACKGROUND OF THE INVENTION

1. Field of the Invention

Generally, the present disclosure relates to the formation of microstructures, such as advanced integrated circuits, and, more particularly, to the formation and examination of conductive structures, such as metal regions, and their characteristics during stress conditions.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep submicron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these inter-connect lines have to be reduced to compensate for a reduced amount of available floor space and for an increased number of circuit elements provided per unit die area. The reduced cross-sectional area of the interconnect lines, possibly in combination with an increase in the static power consumption of extremely scaled transistor elements, may require a plurality of stacked metallization layers to meet the requirements in view of a tolerable current density in the metal lines.

Advanced integrated circuits, including transistor elements having a critical dimension of 0.13 µm and even less, may, however, require significantly increased current densities in the individual interconnect lines, despite the provision of a relatively large number of metallization layers, owing to the significant number of circuit elements per unit area. Operating the interconnect lines at elevated current densities, however, may entail a plurality of problems related to stress-induced line degradation, which may finally lead to a premature failure of the integrated circuit. One prominent phenomenon in this respect is the current-induced material transportation in metal regions, i.e., lines and vias, also referred to as "electromigration," which may lead to the formation of voids within and hillocks or protrusions next to the metal regions, thereby resulting in reduced performance and reliability or complete failure of the device. For instance, aluminum lines and vias embedded into silicon dioxide and/or silicon nitride are frequently used as metal for metallization layers, wherein, as explained above, advanced integrated circuits having critical dimensions of 0.18 µm or less, may require significantly reduced cross-sectional areas of the metal lines and, thus, increased current densities, which may render aluminum less attractive for the formation of metallization layers.

Consequently, aluminum is increasingly being replaced by copper as copper exhibits a significantly lower resistivity and exhibits significant electromigration effects at considerably higher current densities as compared to aluminum. The introduction of copper into the fabrication of microstructures and integrated circuits comes along with a plurality of severe problems residing in copper's characteristic to readily diffuse in silicon dioxide and a plurality of low-k dielectric materials. To provide the necessary adhesion and to avoid the undesired diffusion of copper atoms into sensitive device regions, it is, therefore, usually necessary to provide a barrier layer between the copper and the dielectric material in which the copper lines and vias are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitance of neighboring copper lines. Hence, a thin conductive barrier layer that also imparts the required mechanical stability to the copper is formed to separate the bulk copper from the surrounding dielectric material, and only a thin silicon nitride or silicon carbide or silicon carbon nitride layer in the form of a capping layer is frequently used in copper-based metallization layers. Currently, tantalum, titanium, tungsten, tungsten/cobalt/phosphorous compounds, tungsten/cobalt/boron compounds and their compounds with nitrogen and silicon and the like are preferred candidates for a conductive barrier layer, wherein the barrier layer may comprise two or more sub-layers of different composition to meet the requirements in terms of diffusion suppressing and adhesion properties.

Another characteristic of copper significantly distinguishing it from aluminum is the fact that copper may not be readily deposited in large amounts by chemical and physical vapor deposition techniques. Additionally, copper may not be efficiently patterned by anisotropic dry etch processes, thereby requiring a process strategy that is commonly referred to as the damascene or inlaid technique. In the damascene process, first a dielectric layer is formed which is then patterned to include trenches and vias which are subsequently filled with copper or copper alloys, wherein, as previously noted, prior to filling in the copper-based metal, a conductive barrier layer is formed within the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.1 µm or even less in combination with trenches having a width ranging from 0.1 µm or less to several µm. Although electrochemical deposition processes for copper are well established in the field of electronic circuit board fabrication, a substantially void-free filling of high aspect ratio vias is an extremely complex and challenging task, wherein the characteristics of the finally obtained copper metal line depend significantly on process parameters, materials and geometry of the structure of interest. Since the dimensions of interconnect structures are determined by the design requirements and may, therefore, not be significantly altered for a given microstructure, it is of great importance to estimate and control the impact of materials, such as conductive and non-conductive barrier layers, of the copper-based microstructure and their mutual interaction on the characteristics of the interconnect structure so as to insure both high yield and the required product reliability. In particular, it is important to identify and monitor degradation and failure mechanisms in interconnect structures for various configurations to maintain device reliability for every new device generation or technology node.

Accordingly, a great deal of effort has been made in the past decades in investigating the degradation of copper lines and vias, especially in view of electromigration, in order to find new materials and process strategies for forming copper-based metal lines and vias. Although the exact mechanism of electromigration in copper lines and vias is still not quite fully understood, it turns out that voids positioned in and on sidewalls and interfaces and voids and residuals at the via bottom may have a significant impact on production yield and reliability. Except for gross failures, such defects in vias, which may be provided in the form of via chains as control monitor structures in wafer scribe lines, are difficult to detect in standard electrical testing procedures. Thus, great efforts are made in designing appropriately configured test structures in order to estimate the electromigration behavior of vias and lines to estimate the expected time to failure for vias and metal lines, wherein the results may be indicative for the specifics of actual metallization structures only when well-defined conditions may be established in the test structure. Otherwise, the respective test results may lead to substantially meaningless statements with respect to the actual circuit features. For example, for estimating the mean time to failure of a via and a line connected thereto, which are manufactured according to a specific process flow on the basis of specified materials, such as copper, aluminum, silver and the like, including specific barrier materials, a test structure is formed on the basis of the specific process flow, wherein the design of the test structure is selected such that an electromigration induced failure, i.e., a respective flux divergence of the material flux in the line or via, is caused in a specified section of the test structure only. Thus, by applying well-defined stress conditions, such as temperature and an injected current, the respective section may be monitored with respect to a resistance increase that may indicate an electromigration induced void formation and thus a line or via failure.

With reference to FIGS. 1a-1c, a typical conventional test structure for estimating electromigration effects in metallization layers of semiconductor devices will now be described in more detail in order to demonstrate the principles and the problems associated with the conventional test regime.

FIG. 1a schematically illustrates a cross-sectional view of a portion of a test structure 100 comprising a substrate 101, which may represent any appropriate substrate for forming semiconductor devices or any other microstructural features which require a metallization layer for providing electrical connections in accordance with a specific circuit layout. For instance, the substrate 101 may represent a semiconductor substrate, such as a silicon substrate, having formed thereon a respective semiconductor layer suitable for the formation of circuit elements, such as transistors, capacitors and the like. A first dielectric layer 102, which may be comprised of any appropriate dielectric material as may be used in the metallization layer under consideration, is formed above the substrate 101 and may represent the dielectric material of a respective metallization layer. For instance, the dielectric layer 102 may be formed on the basis of the same process techniques and materials as are used for metallization layers in other substrates or the layer 102 may represent a portion of a metallization layer of a semiconductor device including the test structure 100 at a specific substrate location. Moreover, a metal line 103 may be formed within the dielectric layer 102 and may have specified dimensions and characteristics so as to exhibit a reduced probability for suffering from electromigration effects, that is, metal diffusion when subjected to predefined test conditions. The metal line 103 may be confined by a conductive barrier layer 104, comprised of, for instance, tantalum and the like, and a dielectric cap layer 109 that may be comprised of any appropriate material, such as silicon nitride and the like. Furthermore, respective metal lines 106 are provided in a next metallization level comprising a further dielectric layer 108 including a cap layer 110, wherein the metal lines 106 are connected to the metal line 103 by respective vias 105. Similar to the metal line 103, the lines 106 and the vias may also include a conductive barrier layer 107.

The test structure 100 may represent a test structure for evaluating the reliability of the metallization level comprising the metal lines 106 and the vias 105. As previously explained, electromigration effects have been the subject of extensive investigations over several decades, wherein it was recognized that electromigration, originating from the interaction of the moving electrons with diffusing metal atoms, thereby exerting a net force on the diffusing metal atoms at high charge carrier densities, may be one dominant reason for premature device failure, thus requiring efficient mechanisms for identifying and avoiding or reducing metal line and via degradation mechanisms. Since electromigration is an interaction between electrons and diffusing metal atoms, such as increased diffusion activity, for instance due to increased temperature, an increased degree of lattice defects, or in general due to the presence of increased diffusion paths, such as grain boundaries, respective interfaces and the like, electromigration is highly dependent on the specific manufacturing techniques and materials used. In advanced semiconductor devices, the dimensions of the respective vias and metal lines may also have a significant influence on the finally achieved degree of material transport within the metal lines. Although, in modern semiconductor devices, copper and copper alloys are frequently used which exhibit a significantly higher resistance against electromigration and have a lower electrical resistance, the ongoing reduction in line width has resulted in moderately high current densities, also causing a high degree of electromigration in copper-based metallization layers. Since a plurality of complex mechanisms may have a significant influence on the electromigration behavior, such as grain size, grain orientation, type of barrier material used, type of dielectric barrier materials and the like, it is of great importance to effectively monitor manufacturing techniques in order to control and improve product reliability. Thus, specifically designed test structures, such as the structure 100, have been developed, which may enable obtaining meaningful estimations on the electromigration characteristics.

When the characteristics of the lines and vias 106, 105 are to be examined, the metal line 103 is typically configured such that, with respect to the respective electromigration conditions, a corresponding material transport may substantially not occur. For this purpose, in conventional techniques, the line 103 may have a significantly reduced length compared to the lines 106, which are typically formed on the basis of design rules of actual devices.

FIG. 1b schematically illustrates a top view of the test structure 100 as shown in FIG. 1a, wherein voltage taps 111 are shown which are connected to the line 106, which may be considered as a device under test (DUT). Hence, the voltage taps 111 enable obtaining measurement values with respect to resistance degradation of the line 106 during an electromigration test.

FIG. 1c schematically illustrates a top view of the structure 100 according to a space-efficient implementation, wherein a plurality of lines 106 are connected by means of the vias 105 and respective short metal lines 103. The test chain of the structure 100 allows enhanced measurement accuracy and statistical significance, due to the plurality of metal lines 106 involved, wherein the measurement data may be obtained by appropriately positioned voltage taps, such as the taps 111.

The test structure 100 may be formed on the basis of well-established techniques, using the inlaid or damascene technique, wherein, as previously explained, the conductive barrier layer 107 is provided in order to obtain the required characteristics with respect to the suppression of diffusion of copper into the dielectric material and diffusion of reactive components into the copper-based metal regions, wherein, additionally, the characteristics of the barrier layer 107 may significantly affect the electromigration behavior.

During operation of the test structure 100, a respective current may be injected into the lines 106 in order to create an electron flow from one of the lines 106 to another line 106 via the metal line 103 and the vias 105. By means of the voltage taps 111, a respective resistance increase may be detected which indicates a corresponding void formation in the via 105 and/or the metal line 106, since these components are expected to be the "weakest" members of the entire conductive path. Consequently, the resistance change may be used as an indication for the electromigration behavior of the interconnect system including the via 105 and the metal line 106. For example, respective mean times to failure may be estimated on the basis of the resistance measurements. In practice, the corresponding time to failure and, thus, the reliability metrics derived from the test structure 100 may, in some cases, lead to unrealistic predictions for actual devices, especially for extremely scaled metallization structures involving the formation of respective barrier layers. For example, the corresponding barrier layer 107 may have been formed with reduced thickness or coverage at the bottom of one or more of the vias 105 due to process related non-uniformities during the physical vapor deposition, as is typically used for applying the barrier layer 107. Due to the non-uniformity of the barrier layer 107 at the via bottom, a significant mass flow may also occur in the metal line 103 during the stress test, thereby acting as a reservoir of copper for the metal line 106 located downstream of the metal line 103, representing the device under consideration. Hence, a regular void formation, corresponding to the electromigration conditions presently established, in the metal line 106 under consideration may be significantly reduced due to the replenishment of lost copper by the mass flow through the line 103, which is usually expected to lack a significant mass flow. As a consequence, based on the electromigration test, the line 106 under consideration may indicate a long life time and thus reliability of the respective actual metallization structures, while, however, the test structure 100 itself may be faulty, thereby rendering the measurement results of the test structure 100 less reliable.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is related to a technique for assessing stress migration effects, such as electromigration of complex metallization structures including vias and metal lines formed on the basis of a barrier layer, wherein the characteristics of the barrier layer, at least within specific test vias, may not negatively affect measurement results obtained on the basis of a respective test structure. As previously explained, in conventional test structures for estimating electromigration effects, the significance of a corresponding measurement result may depend on the characteristics of the barrier layer at the bottom of the corresponding test vias since a reduced coverage of the via bottom may result in a significant mass flow within a line segment, which is actually expected to substantially not contribute to the electromigration behavior. For instance, the presence of porous areas or holes within the barrier layer at the via bottoms may result in a mass flow, thereby possibly shifting the electromigration failure from the actual line/via pair under consideration to other areas of the test structure, which may imply longer lifetimes of the line/via pair under consideration compared to the actual electromigration performance. In order to significantly reduce the deleterious effects of non-uniformities of the barrier layers in via bottoms of respective text structures with respect to the assessment of electromigration or other stress-induced migration effects, the present disclosure relates to a technique in which well-defined locations within test structures are provided that exhibit a high blocking capability with respect to stress-induced mass flow. In this way, the relevance of corresponding measurement results and thus performance estimations of metallization structures may be increased by effectively establishing an independency of the measurement result from the characteristics of the barrier layer, especially at via bottoms in the test structure.

According to one illustrative embodiment, a chain structure for electromigration tests comprises a first line segment and a second line segment formed in a first metallization layer located above a substrate appropriate for forming semiconductor devices for an integrated circuit thereon. The chain structure further comprises a first via connected to the first line segment and having a barrier layer at a bottom surface thereof, wherein the barrier layer has a first mass flow blocking capability. Furthermore, a second via is provided and is connected to a second line segment and has the barrier layer with a second mass flow blocking capability, wherein the first mass flow blocking capability is less than the second mass flow blocking capability. Finally, a third line segment is formed in a second metallization layer and is connected to at least one of the first and second vias.

According to another illustrative embodiment, a test structure for estimating electromigration effects in a metallization layer of a semiconductor device is provided. The test structure comprises a first line segment having a first width, wherein the first line segment is formed in a first metallization layer. Furthermore, a second line segment having a second width greater than the first width is formed in the first metallization layer. Moreover, a first via connected to the first line segment and a second via connected to the second line segment are provided. Finally, a third line segment is formed in a second metallization layer and is connected to at least one of the first and second vias.

According to yet another illustrative embodiment, a method comprises forming a trench and a via opening connected to the trench for a first line segment and a first via of a test structure in a first metallization layer that is formed above a substrate, wherein the substrate comprises a plurality of semiconductor devices. The method further comprises forming a trench and a via opening thereto for a second line segment and a second via of the test structure. Furthermore, a conductive barrier layer is formed in the trenches and via openings by establishing a first deposition rate at the first via and a second deposition rate at the second via, wherein the first deposition rate is less than the second deposition rate.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a top view of a portion of the test structure as shown in FIG. 1a;

FIG. 2b schematically illustrates a top view of one implementation of the structure of FIG. 2a;

Figure 1A:
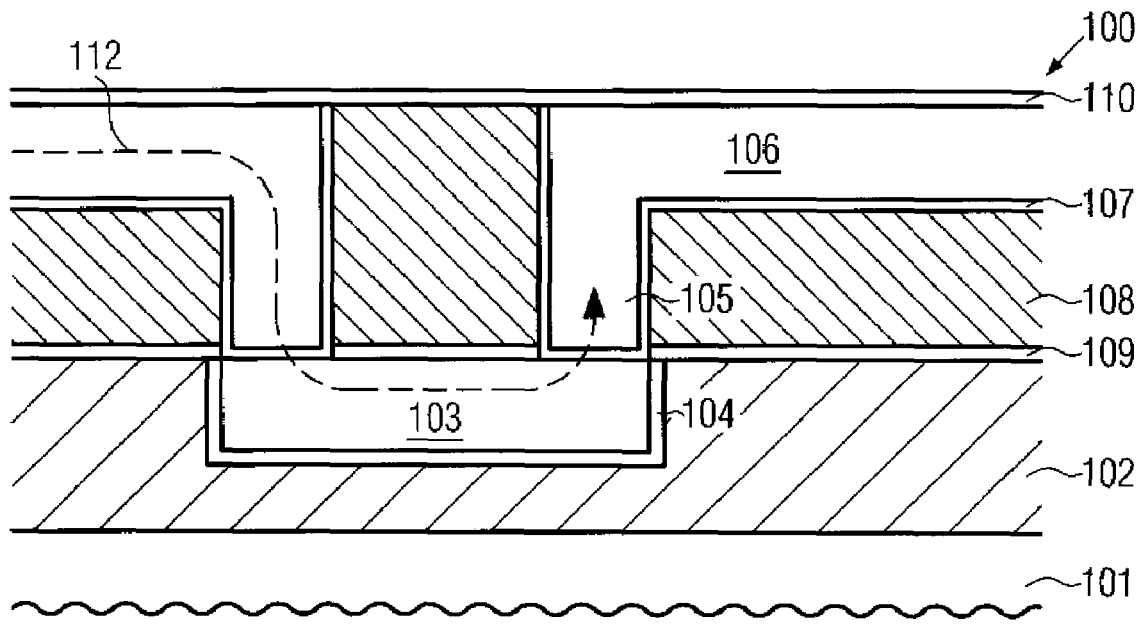
FIG. 1a schematically illustrates a cross-sectional view of a conventional test structure for estimating electromigration effects wherein the significance of measurement results may depend on characteristics of the barrier layer at the respective via bottoms.
Figure 1B:
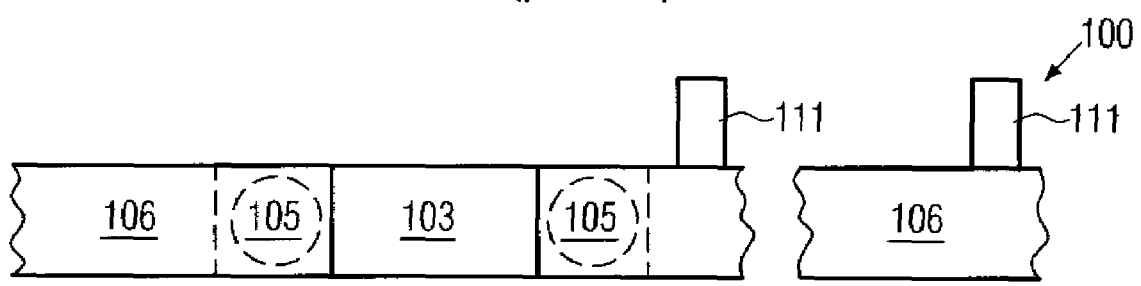
Figure 1C:
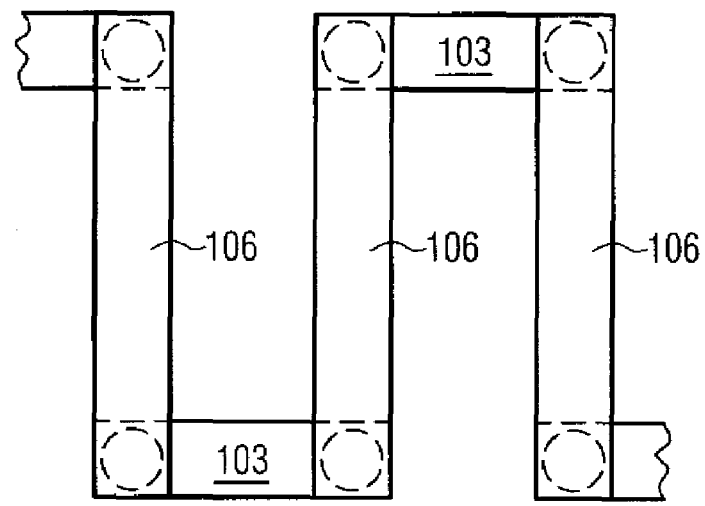
FIG. 1c schematically illustrates a top view of a typical implementation of a conventional chain structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to a technique for enhancing the capability of stress migration test procedures in order to obtain an assessment of the test structure under consideration with increased reliability and significance. As previously explained, stress-induced mass transport, such as electromigration, is a highly complex dynamic process, in which the momentum exchange between the charge carriers, such as electrons in metals and diffusing metal atoms, may result in a directed motion of the diffusion atoms when sufficiently high current densities are achieved. Due to the reduced cross-sectional areas of metal lines and vias in sophisticated integrated circuits and due to the fact that, in principle, the respective metal lines are confined in a respective dielectric material allowing an efficient heat transfer into the surrounding chip area, extremely high current densities of approximately $10^6$ Ampere/cm$^2$ may be achieved, which brings about significant electromigration effects. Thus, for practical reasons, the metallization structure of respective semiconductor devices may not be designed and manufactured in such a way that respective high current densities may be reliably avoided in any metal region of the semiconductor devices, and a significant degree of electromigration may therefore occur during the operation of the respective semiconductor devices. A corresponding design of semiconductor devices tailored to substantially avoid electromigration effects would significantly reduce the design flexibility and would require reduced packing densities, thereby significantly reducing performance and cost efficiency of the respective semiconductor devices. Consequently, a compromise is typically made between performance and packing density with respect to electromigration in that design and manufacturing criteria are selected such that a desired lifetime under specific operation conditions may be achieved rather than manufacturing substantially "immortal" metallization structures. As a consequence, it is extremely important to reliably estimate the expected lifetime of metallization structures of semiconductor devices, which is usually performed on the basis of respective test structures operated on the basis of stress conditions involving high current densities and high temperatures, wherein the time to failure may provide an indication for the actual lifetime of the respective metallization structure under real operational conditions. Although certain theoretical models of the electromigration characteristics have been established, for instance, known under Black's Law, which indicates a relationship between a typical time to failure and the square of the inverse current density, which quantitatively describes the effect of electromigration for a certain class of conditions, for instance, metal lines without confining barrier layers and the like, at a moderate accuracy, it nevertheless turns out that, due to the significant influence of diffusion on the final electromigration effects, a theoretical prediction of the finally obtained time to failure is extremely complex and may not be sufficient to reliably estimate the characteristics of complex metallization structures as are typically used in sophisticated integrated circuits. Even the characteristics of the respective test structures may have a significant influence on the outcome of the respective lifetime tests wherein, for instance, an incorrectly predicted time to failure during corresponding electromigration tests may result in an incorrectly predicted lifetime of the actual semiconductor devices, thereby contributing to a reduced reliability of the respective products, which may result in a significant economic risk for the semiconductor manufacturer.

According to the present disclosure, the significant dependency on barrier characteristics at via bottoms of respective electromigration test structures may be reduced in that appropriately positioned areas of increased mass flow blocking capability may be provided within the test structure in order to reduce material flow into a test structure area, which may be considered as a device under test (DUT) for estimating the corresponding electromigration behavior. Thus, by reducing or even substantially completely avoiding a mass flow into respective test segments of the test structure, the probability of incorrectly assessing the degradation within the test area under consideration may be significantly reduced. As previously explained with reference to FIG. 1a, the bottom surface of respective vias 105 may represent an area which is subjected to process fluctuations during the formation of respective barrier layers, wherein an incorrectly manufactured barrier layer at the via bottom may give rise to a significant mass flow through the bottom surface, thereby acting as a source of additional conductive material. This additional metal may affect the electromigration behavior of any test structure area positioned downstream from the respective via bottom surface. Thus, as described herein, a bottom surface of a via located upstream from a respective line segment under consideration may be provided with an increased mass flow blocking capability in order to at least reduce any undue metal transport into the line segment under consideration.

In some illustrative embodiments, the increased blocking capability of the bottom surface may be obtained by providing an enhanced thickness and/or increased uniformity of the barrier material at the via bottom. The enhancement of thickness and/or uniformity of the respective barrier material may be selectively obtained in some illustrative embodiments by appropriately adjusting a deposition rate during the formation of the barrier layer. In other cases, other deposition parameters, such as deposition time and the like, may be selectively adjusted in order to locally provide mass flow blocking areas upstream of actual test segments of the respective test structure.

It should be appreciated that the subject matter of the present disclosure is highly advantageous in the context of sophisticated semiconductor devices requiring metallization structures, for instance, based on copper, copper alloys and other highly conductive metals in combination with circuit elements having critical dimensions of 100 nm and significantly less, since here highly complex manufacturing procedures, such as inlaid techniques in the form of dual damascene processes, are typically used during the fabrication of metallization layers. For instance, highly conductive metals, such as copper and copper alloys and the like, are provided with appropriate barrier layers, which are to be filled in on the basis of sophisticated deposition techniques, such is physical vapor deposition. During the deposition of the barrier material, process non-uniformities, especially at the respective via bottoms, may thus represent a critical phase of the entire manufacturing process, since these device areas may lead to a unrealistic lifetime estimation, as previously explained. It should be appreciated, however, that the principles disclosed herein may be readily applied to any type of metallization layer irrespective of the specifics of the materials used and of the manufacturing technique employed as long as metal vias are provided, in which a barrier layer is required, the characteristics of which may significantly affect the overall electromigration behavior. Thus, unless explicitly set forth in the specification or the appended claims, the present invention should not be considered as being restricted to copper-based metallization structures formed on the basis of inlaid techniques.

Figure 2A:
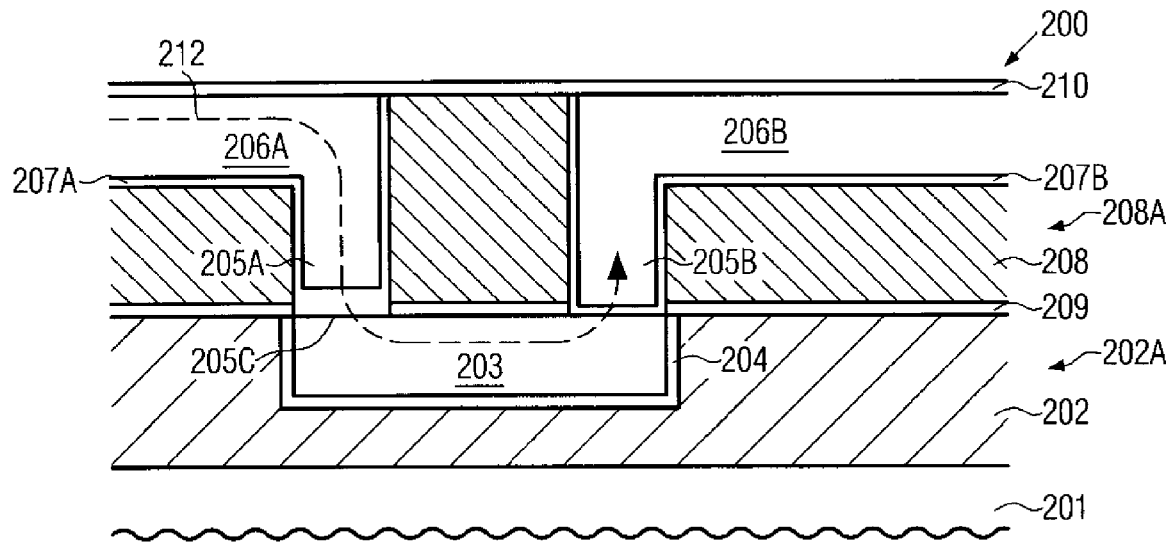
FIG. 2a schematically illustrates a cross-sectional view of a portion of a test structure according to one illustrative embodiment wherein via bottoms of different mass flow blocking capability are provided.

FIG. 2a schematically illustrated a cross-sectional view of a portion of a test structure 200 configured to estimate the electromigration or other stress-induced migration effects of metallization structures used for semiconductor devices, such as sophisticated copper-based integrated circuits. The test structure 200 may be formed above a substrate 201, which may represent any appropriate carrier material for forming therein and thereon respective circuit elements, such as transistors, capacitors and the like, that require additional wiring levels, i.e., metallization layers for interconnecting the individual circuit elements according to a specified circuit layout. For example, the substrate 201 may represent a bulk semiconductor substrate, such as a silicon substrate, a silicon-on-insulator (SOI) substrate and the like. In some illustrative embodiments, the substrate 201 may represent a dedicated test substrate, which may have formed on a specified substrate area thereof the test structure 200. In other cases, the substrate 201 may have formed thereon a plurality of semiconductor devices, such as integrated circuit die, wherein the test structure 200 may be provided at respective substrate areas, such as chip internal areas, scribe lines, dedicated test die and the like. In this case, the test structure 200 may be used for estimating the performance of respective metallization features of actual product devices that may be formed together with the test structure 200 in a common manufacturing sequence above the substrate 201.

A first metallization layer 202A may be formed above the substrate 201, wherein the first metallization layer 202A may comprise a dielectric layer 202 which may be comprised of any appropriate material as is typically used for respective metallization layers of actual semiconductor devices. For instance, in sophisticated applications, the dielectric layer 202 may comprise a low-k dielectric material, possibly in combination with other dielectric materials, such as silicon dioxide, silicon nitride, silicon carbide and the like. Furthermore, a respective metal region 203, which may be provided in the form of a line segment, may be provided within the dielectric layer 202, wherein typically an appropriate barrier layer 204 may be provided in order to suppress any undue interaction of the material of the line segment 203 and material of the layer 202. In sophisticated applications, the line segment 203 may comprise copper, possibly in combination with other metal species, while the barrier layer 204 may include any appropriate material such as tantalum, tantalum nitride, titanium, titanium nitride, tungsten, boron, phosphorous or any combinations thereof. The first metallization layer 202A may also comprise a corresponding cap layer 209, which may have etch stop characteristics and may also provide efficient confinement of the metal in the line segment 203. For instance, silicon nitride, silicon carbide, nitrogen-enriched silicon carbide and the like may frequently be used in respective metallization schemes in order to provide appropriate interface characteristics to underlying copper-based metal regions to avoid undue interaction with adjacent dielectric materials and to achieve the desired electromigration performance.

A second metallization layer 208A may be formed above the first metallization layer 202A and may comprise a dielectric layer 208 that may be made of any appropriate dielectric material as dictated by the design rules for respective semiconductor devices under consideration. For instance, the dielectric layer 208 may comprise a low-k dielectric material, wherein the configuration of the layer 208 may be the same or may be different compared to the configuration of the layer 202. Furthermore, the metallization layer 208A may comprise respective line segments 206A, 206B at least one of which may be considered as a "device under test" with respect to the stress-induced migration behavior in order to estimate the corresponding performance of respective product devices, which may be provided at respective device areas of the metallization layer 208A. In the embodiment shown, the line segment 206B may represent a corresponding test line segment and may therefore be formed in accordance with appropriate design criteria so as to provide a high degree of authenticity with respect to actual product metallization structures. Furthermore, the respective line segments 206A, 206B may be connected to respective vias 205A, 205B which, in the embodiment shown, may connect to the line segment 203 formed in the first metallization layer 202A. The line segments 206A, 206B and the corresponding vias 205A, 205B may comprise a barrier layer 207A, 207B comprised of any appropriate material as required by the design rules for a corresponding semiconductor device under consideration. That is, at least within the via 205B and the line segment 206B, the barrier layer 207B may have a similar configuration compared to actual circuit elements formed in metallization layer 208A or in other product substrates having formed thereon a respective metallization layer 208A. Thus, at a respective bottom surface 205C of the via 205B, the barrier layer 207B may be provided in a substantially identical manner relative to actual product devices due to the similarity of the respective design dimensions and the process conditions during the corresponding manufacturing sequence compared to actual semiconductor devices. On the other hand, the barrier layer 207A within the via 205A may differ, at least at the corresponding bottom surface 205C, with respect to its blocking capability for a stress-induced mass flow through the bottom surface 205C of the via 205A. In the embodiment shown, a thickness of the barrier layer 207A, at least at the bottom surface 205C, may be significantly higher compared to the corresponding thickness of the layer 207B (at the bottom surface 205C of the via 205B), thereby providing a substantially continuous and thus reliable coverage of the bottom surface 205C of the via 205A irrespective of the actual configuration of the barrier layer 207B, especially at the respective bottom of the via 205B. For example, in sophisticated applications, the barrier material at the bottom surface 205C of the via 205B and, thus, in actual semiconductor devices, may have a thickness in the range from a few nanometers to ten or more nanometers, wherein the finally achieved thickness and coverage may depend significantly on process variations, the dimensions of the via 205B and the like. On the other hand, the barrier layer 207A may be provided at the bottom surface 205C of the via 205A with increased thickness, for instance, with an additional thickness of several nanometers compared to the layer 207B, thereby providing a continuous layer at the bottom surface 205C so as to reduce or substantially avoid any metal diffusion through the layer 207A during operation of the test structure 200.

Furthermore, the line segments 206A, 206B and the vias 205A, 205B may comprise an appropriate metal, such as copper, copper alloys, as dictated by device requirements. Finally, an appropriate cap layer 210 may be provided in the metallization layer 208A in order to efficiently confine the metal in the line segments 206A, 206B as is also previously explained with respect to the cap layer 209.

The test structure 200 may be formed on the basis of process techniques as will be described later on in more detail when referring to FIGS. 2b-2e.

During operation, the stress-induced degradation of the line segment 206B in combination with the via 205B may be examined in order to estimate the performance of the actual metallization structures of respective semiconductor devices. For this purpose, a current may be forced through the test structure 200, for instance, an electron current flow may be created, which may flow from the line segment 206A through the via 205A, the line segment 203 to the via 205B and the line segment 206B, as indicated by the arrow 212. The corresponding current flow 212 may be established by forcing a specified current through the structure 200, thereby causing a specified current density within the via 205B and the line segment 206B as determined by the respective dimensions of these components. Furthermore, typically specified stress conditions, such as an elevated temperature, may be applied in order to accelerate the degradation in the line segment 206B. As previously explained, a significant electromigration effect may occur in the line segment 206B or the via 205B resulting in a significant creation of respective voids which may not, however, be substantially "refilled" by material of the line segment 206A and the via 205A due to the enhanced mass flow blocking capability of the barrier layer 207A at the bottom 205C, which substantially avoids or reduces a diffusion of metal atoms into the line segment 203 and further into the via 205B, even if the via 205B may not provide efficient mass flow blocking capabilities due to an insufficient coverage or thickness of the barrier layer 207B at the surface 205C. Furthermore, a significant mass flow stemming from the line segment 203 may be substantially suppressed due to dimensional characteristics of the segment 203, such as the length thereof, which may be selected with respect to the maximum current density during the test in order to reliably avoid electromigration effects within the segment 203. Consequently, the line segment 206B, in combination with the via 205B, may be assessed with respect to line degradation or resistance increase on the basis of a realistic electromigration behavior of the line segment 206B and the via 205B. On the other hand, the condition of the barrier layer 207B, although in total influencing the overall performance of the line/via pair 206B, 205B, may, nevertheless, provide meaningful measurement results due to the reduction or substantial avoidance of metal diffusion from the line segments 206A, 203 and the via 205A into the line/via pair of interest. Consequently, increased robustness of the test structure 200 with respect to variations of the characteristics of the barrier layer 207B at the via bottom 205C may be obtained.

Figure 2B:
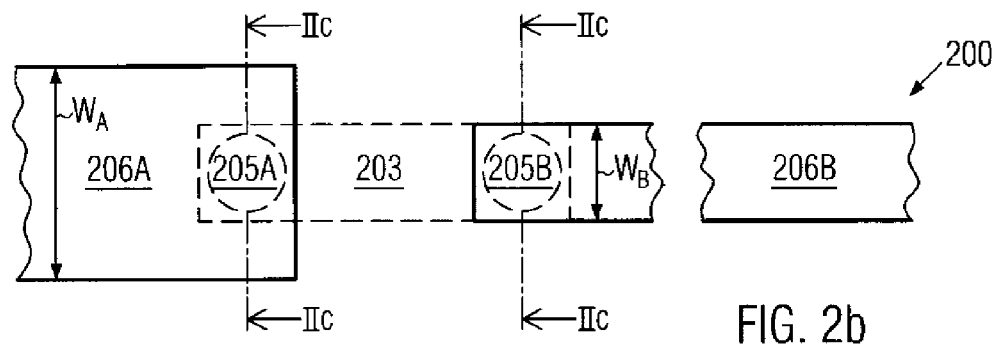

FIG. 2b schematically illustrates a top view of the test structure 200 in accordance with one illustrative embodiment, wherein, for convenience, the respective dielectric materials of the layers 210, 208, 209 and 202 may not be visible. In the embodiment shown, the line segment 206A may have a width indicated as $W_A$ which is greater than a corresponding line width $W_B$ of the line segment 206B. Thus, the width $W_B$ may represent the lateral dimensions of respective metal lines for production devices, the electromigration behavior of which may be examined on the basis of the test structure 200, while the increased width $W_A$ of the line segment 206A may provide superior deposition conditions in order to provide increased barrier thickness and hence increased mass flow blocking capability of the via 205A. For example, the width $W_A$ may be twice the width of $W_B$ or even greater, depending on the degree of desired mass flow blocking capability of the via 205A.

Figure 2C:
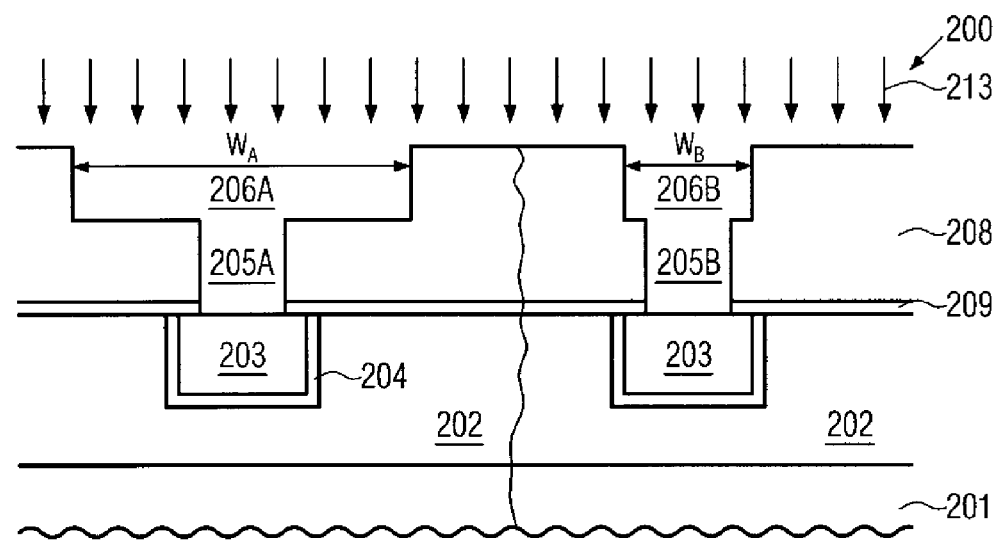
FIG. 2c schematically illustrates respective cross-sectional views including line segments of different widths according to illustrative embodiments.

FIG. 2c schematically illustrates cross-sectional views of the segments 206A connected to the respective vias 205A and the line segment 206B connected to the via 205B in an early manufacturing stage, that is, prior to the deposition of the barrier layers 207A, 207B. For convenience, the respective trenches and via openings are also indicated by the same reference numerals as the corresponding line segments and vias when filled with the respective barrier materials 207A, 207B and the respective metal components.

The test structure 200 corresponding to the manufacturing stage as shown in FIG. 2c may be formed on the basis of the following processes. After providing the substrate 201 and forming thereon the respective circuit elements in a specified semiconductor layer, when the substrate 201 may represent a substrate including the test structure 200 and respective actual semiconductor devices, the first metallization layer 202A may be formed by depositing an appropriate dielectric material in order to provide the dielectric layer 202. For instance, well-established deposition techniques may be used for this purpose. Thereafter, the dielectric layer 202 may be patterned to receive respective trenches corresponding to the desired dimensions of the line segments 203. For this purpose, appropriately configured lithography masks may be used in order to form a respective resist mask that may be used for patterning the dielectric layer 202 on the basis of well-established anisotropic etch techniques. Thereafter, the barrier layer 204 may be formed on the basis of appropriate deposition techniques, such as physical vapor deposition, for example, in the form of sputter deposition and the like. Next, a seed layer (not shown) may be provided, for instance, in the form of a copper layer, which may be formed on the basis of any appropriate deposition technique, such as sputter deposition and the like. Subsequently, an appropriate metal, such as copper, copper alloys and the like, may be filled into the respective openings on the basis of a wet chemical deposition technique followed by the removal of any excess material of the barrier layer 204, the seed layer and the bulk metal. For this purpose, etch and/or chemical mechanical polishing (CMP) techniques may be used. Subsequently, the cap layer 209 may be deposited on the basis of well-established recipes. Next, the dielectric material for the layer 208 may be formed in accordance with device requirements on the basis of well-established techniques, which may include the deposition of different types of dielectric materials, such as low-k dielectric materials and the like. Thereafter, the dielectric layer 208 may be patterned on the basis of an appropriate lithography process, wherein the corresponding lithography process may be adapted to provide the difference in width of the line segments 206A versus the line segments 206B. For example, when a photolithography process is used, a corresponding lithography mask may be provided such that the line segments 206A, 206B may be imaged with the corresponding line width $W_A$ and $W_B$ into a respective resist layer, which may then be used for actually patterning the dielectric material of the layer 208. Depending on the process strategy, the openings for the vias 205A, 205B may be formed prior to actually providing the openings of the respective line segments 206A, 206B or the vias 205A, 205B may be formed after patterning the trenches for the line segments 206A, 206B. Respective patterning regimes are well established in the art and may be used in combination with the subject matter disclosed herein.

Next, the structure 200, possibly in combination with any other metallization structures of actual semiconductor devices formed in other parts of the substrate 201, may be exposed to a deposition ambient 213 for forming a barrier material within the respective openings in the layer 208 in accordance with the design rules. In one illustrative embodiment, the deposition ambient 213 may represent a physical vapor deposition process, such as a sputter deposition process, wherein the corresponding deposition conditions for the line segment 206B and the via 205B may be similar to the respective conditions at actual device features due to the similarity of the respective lateral dimensions of the line segments 206B and the via 205B compared to the design dimensions of actual devices. On the other hand, the corresponding deposition conditions may significantly differ locally for the via 205A due to the significantly increased width $W_A$, which may result in an increased deposition rate in the via 205A compared to the via 205B, thereby providing an increased thickness at the bottom of the via 205A. Thus, by generating an increased density of barrier material in the vicinity of the via 205A during the deposition 213, the mass flow blocking capability of the via 205A may be significantly enhanced substantially without requiring additional processes or treatments, thereby providing a high degree of compatibility with conventional process strategies and thus providing a significant reduction of metal diffusion from the line segment 206A and the via 205A into the line segment 203. On the other hand, the deposition conditions of the process 213 at the segment 206B and the via 205B may substantially correspond to the conditions of actual device features, thereby providing the desired degree of authenticity of the line segment 206B and the via 205B, which may represent the actual test features of the structure 200. After forming the barrier layers 207A, 207B on the basis of the process 213, the further processing may be continued by forming a seed layer (not shown), if required, and depositing the metal components on the basis of wet chemical deposition techniques as previously described with reference to the line segment 203. Thereafter, the resulting surface topography may be planarized by removing any excess material, and the cap layer 210 may be formed on the basis of device requirements in order to complete the test structure 200 as shown in FIG. 2a.

As explained above, the line segment 206B and the via 205B connected thereto may substantially correspond to actual device features, while the line segment 206A may have significantly increased dimensions in order to provide different, i.e., superior, deposition conditions at the via 205A which may have substantially the same dimensions as the via 205B. It should be appreciated that the local variation of the deposition rates during the process 213 may be accomplished on the basis of other strategies, for instance, by varying the lateral dimensions of the via 205A, possibly in combination with a variation of the width $W_A$. In other illustrative embodiments, the amount of barrier material deposited at the bottom 205C of the via 205A may be determined on the basis of a local variation of the respective deposition time, possibly in combination with a locally adapted width $W_A$, for instance, by depositing the barrier layer 207B on the basis of process parameters as demanded by device requirements and subsequently covering the line segment 206B by an appropriately designed resist mask, while further depositing barrier material into the line segment 206A and thus the via 205A.

Figure 2D:
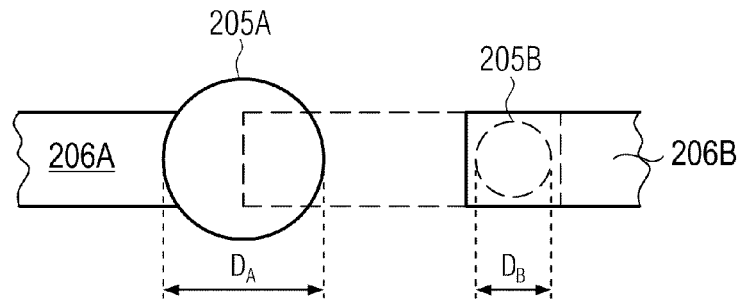
FIGS. 2d and 2e schematically illustrate top views of respective portions for obtaining a different degree of coverage at respective via bottoms according to further illustrative embodiments.

FIG. 2*d* schematically illustrates a top view of the test structure 200 according to an embodiment in which the lateral dimensions of the line segments 206A may be substantially identical to the dimensions of the line segment 206B while the via 205A may have a significantly increased diameter $D_A$ compared to a diameter $D_B$ of the via 205B. For example, the diameter $D_A$ may be twice or more compared to the diameter $D_B$. Due to the increased diameter $D_A$, the coverage of the bottom of the via 205A during the deposition process 213 (see FIG. 2*c*) may be significantly enhanced, thereby also providing an increased thickness of the barrier layer 207A resulting in an increased mass flow blocking capability.

Figure 2E:
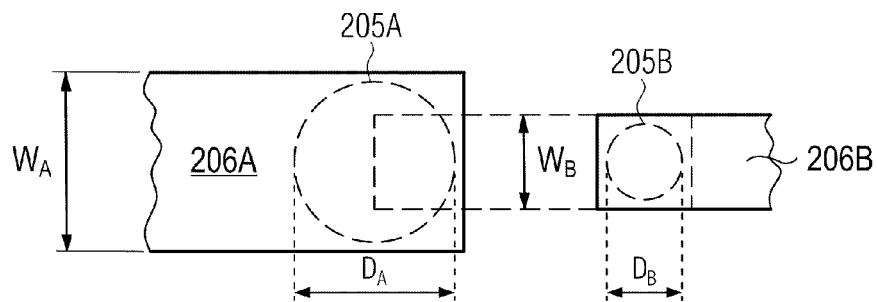

FIG. 2*e* schematically illustrates the test structure 200 in accordance with illustrative embodiments, in which the width $W_A$ as well as the diameter $D_A$ of the line segment 206A and the via 205A may both be increased with respect to the corresponding lateral dimensions of the line segment 206B and the via 205B. In this case, the efficiency of increasing the resulting barrier material thickness at the bottom of the via 205A may further be enhanced, wherein the respective increase of lateral dimension for the line segment 206A and the via 205A may each be less pronounced compared to embodiments as shown in FIGS. 2*b* and 2*d*, since the combined effects may nevertheless provide the desired increased deposition rate. Consequently, in this case, the test structure 200 may be formed with reduced space consumption while nevertheless providing the high blocking capability at the via 205A.

Figure 2F:
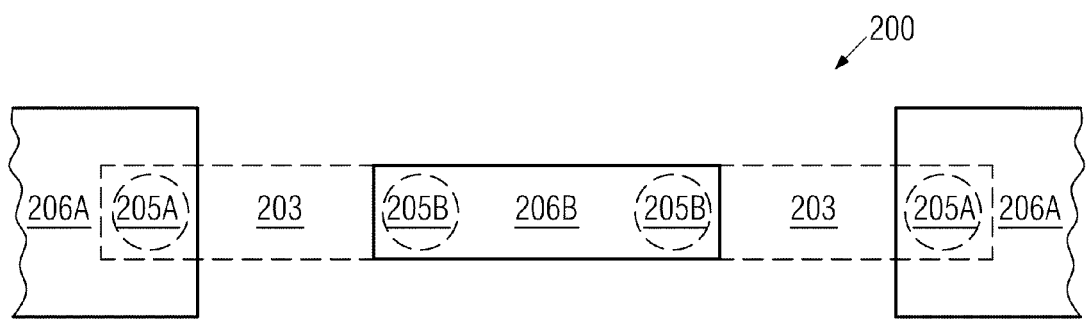
FIGS. 2f and 2g schematically illustrate top views of respective chain structures including a plurality of vias having increased blocking capabilities with respect to a mass flow according to further illustrative embodiments.

FIG. 2*f* schematically illustrates the test structure 200 in the form of a chain structure comprising a plurality of line segments 206A and a plurality of line segments 206B (only one of which is shown) formed in the same metallization layer 208A while a plurality of line segments 203 are formed in the metallization layer 202A and are connected to the respective segments 206A, 206B by the respective vias 205A, 205B. Consequently, an efficient test structure with a plurality of actual DUTs (devices under test), i.e., a combination of vias 205B and line segments 206B, may be provided, wherein each line segment 206B is located between respective vias 205A having the high mass flow blocking capability as previously explained.

Figure 2G:
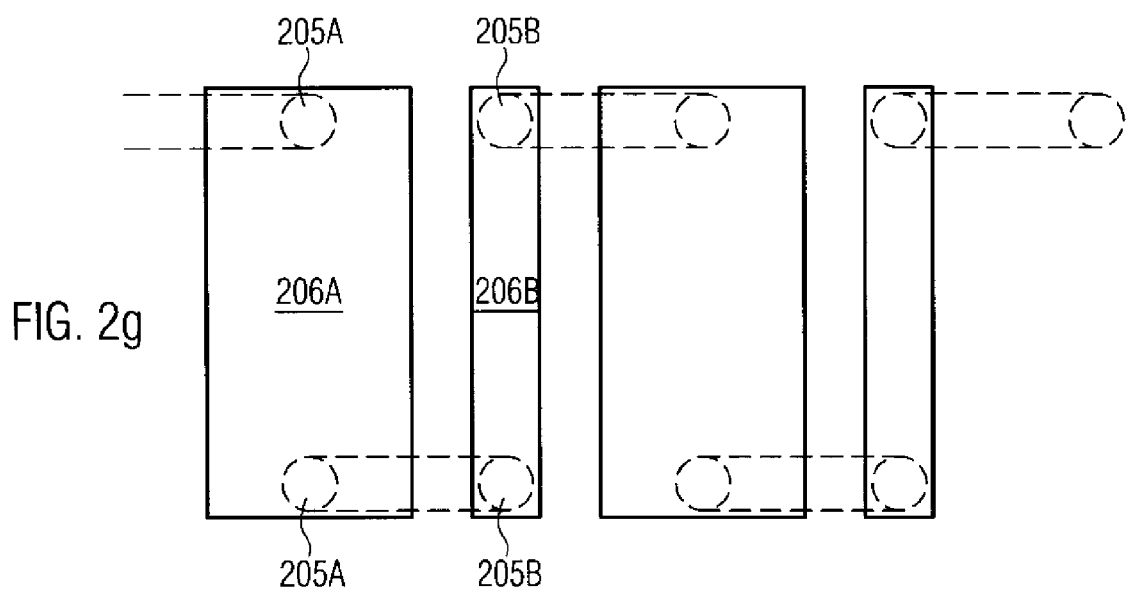

FIG. 2*g* schematically illustrates a further configuration of a chain structure of the test structure 200, wherein increased space efficiency, at least in the horizontal direction, may be achieved by providing the line segments 206A, 206B in a substantially meander-like configuration. Hence, also in this case, the respective line segments 206B are "confined" by respective vias 205A having the increased blocking capability. It should be appreciated that the corresponding linear and folded configurations of the test structure 200 as shown in FIGS. 2*f* and 2*g* are of illustrative nature only and any other geometrical configuration may be selected as long as a respective line segment 206B is preceded, with respect to the current flow direction, by a corresponding via having the enhanced mass flow blocking capability, i.e., one of the vias 205A. It should further be appreciated that the embodiments described above with reference to FIGS. 2*a*-2*g* refer to a test structure, in which the DUT, i.e., the line segments 206B, are provided in the upper metallization layer, while respective connecting line segments, such as the line segments 203, which are typically significantly shorter than the corresponding line segments 206B, are provided in the lower lying metallization layer. This structure or order could be reversed if desired.

Figure 3A:
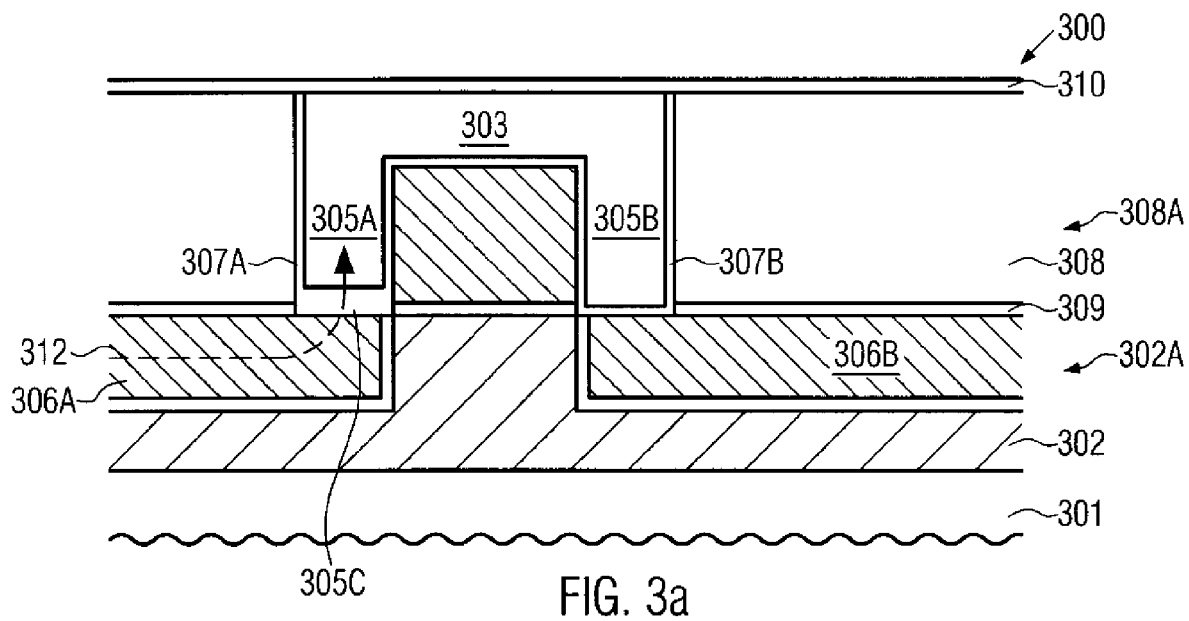
FIG. 3a schematically illustrates a portion of a test structure with vias of increased mass flow blocking capability, wherein respective test lines are formed in a lower lying metallization level according to illustrative embodiments.
Figure 3B:
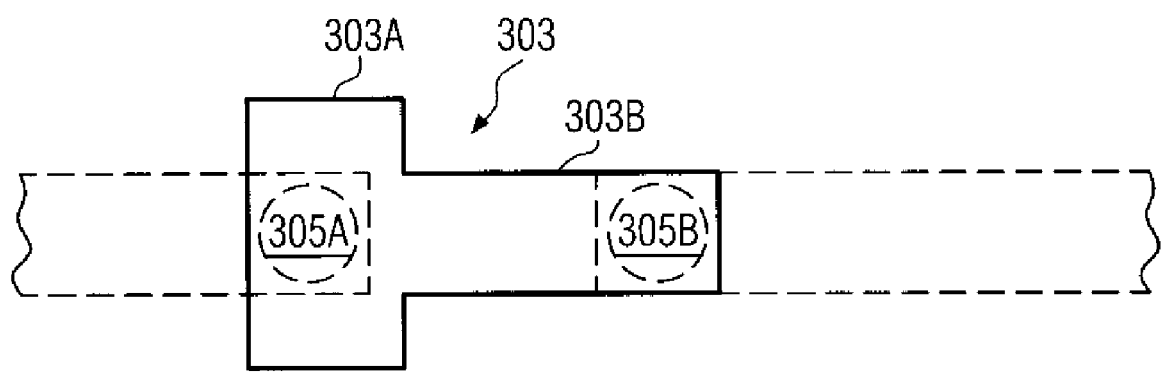
FIGS. 3b and 3c schematically illustrate top views of line segments formed in the same metallization level and directly connected to each other for providing mass flow blocking areas at the respective vias according to further illustrative embodiments.

With reference to FIGS. 3*a*-3*b*, corresponding embodiments will now be described in which the line segments of interest may be provided in the lower lying metallization layer, while the upper metallization layer comprises the corresponding connecting line segments.

FIG. 3*a* schematically illustrates a portion of a test structure 300 comprising a substrate 301, above which are formed a first metallization layer 302A and a second metallization layer 308A. The metallization layer 302A may comprise a dielectric layer 302 having formed therein line segments 306A, 306B which may comprise a respective barrier material 304. Furthermore, a corresponding cap layer 309 may be provided. Similarly, the metallization layer 308A may comprise a dielectric layer 308 having formed therein a line segment 303 connected to the line segments 306A, 306B on the basis of respective vias 305A, 305B. A corresponding barrier material 307B may be formed in the segments 303 and the vias 305A, 305B. In the embodiment shown, the via 305A may have an increased blocking capability with respect to mass flow, as indicated by arrow 312, which may be accomplished on the basis of an enhanced uniformity and/or thickness of the barrier material 307A at the bottom 305C of the via 305A compared to the barrier material 307B at the bottom 305C of the via 305B. Furthermore, a corresponding cap layer 310 may be formed so as confine the line segments 303. With respect to the components described so far, except for the lateral configuration of the line segment 303 and the line segment 306A, substantially the same criteria apply as previously described with reference to the test structure 200. However, in the test structure 300, the line segments 306A, 306B are formed in the first metallization layer 302A and may be used individually or both as DUTs, while the electrical connection is provided by the line segment 303 formed in the first metallization layer 308A. Consequently, during operation of the test structure 300, the increased mass flow blocking capability in the via 305A may enable reliable electromigration assessments on the basis of the line segments 306A and/or 306B, since the via 305A may sufficiently suppress any unwanted material transport from the line segment 306A into the line segment 306B.

FIG. 3*b* schematically illustrates a top view of the test structure 300 according to one illustrative embodiment, in which the line segment 303 may comprise a portion 303A of increased width surrounding the via 305A and a portion 303B having lateral dimensions in accordance with device requirements of actual semiconductor devices. Consequently, during the manufacturing sequence for forming the metallization layer 308A, the barrier material 307A may be formed in the via 305A on the basis of a different deposition rate compared to the via 305B, thereby providing an increased thickness as previously explained. Consequently, the electromigration behavior of the line segments 306A, 306B formed in the "buried" metallization level 302A may also be efficiently assessed.

Figure 3C:
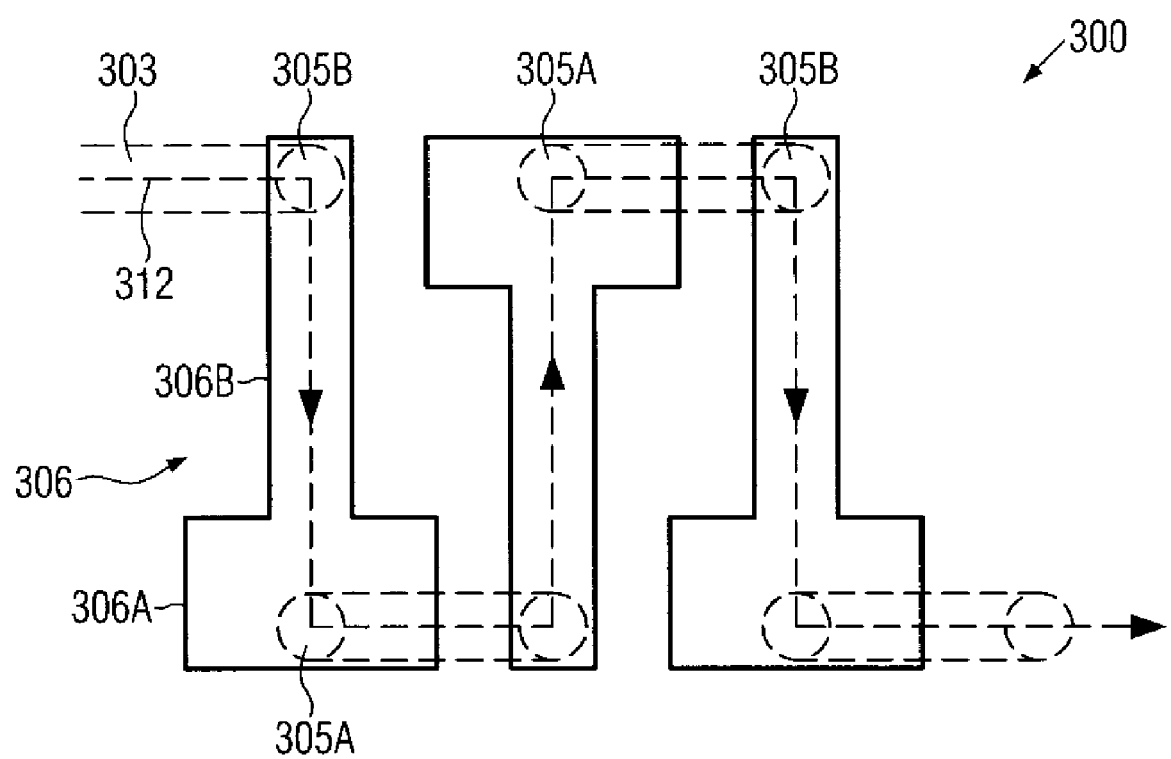

FIG. 3*c* schematically illustrates a top view of the test structure 300 according to a further illustrative embodiment, in which the line segment 303 may be formed in the lower metallization layer 302A, similar to the segments 203, and the line segment 306 may be formed in the upper metallization layer 308A and comprise the line segment 306B in direct contact with the line segment 306A having an increased width so as to provide the desired increased deposition rate during the formation of the barrier layers 307A, 307B. In the embodiment shown, the test structure 300 may represent a chain structure with a space-efficient configuration, wherein a respective combination of the via 305B and the line segment 306B may represent corresponding DUTs, while the via 305A formed below the line segment 306A of increased width may provide the required mass flow blocking capability. For a current flow direction, as indicated by arrow 312, each of the line segments 306B may be used for assessing the electromigration behavior, wherein the corresponding line segments 306A having the increased width may nevertheless be provided with a lateral dimension so as to not significantly influence the overall resistance behavior of the segments 306B. That is, the corresponding size of the line segment 306A may be adapted to the process conditions during the formation of the barrier layer 307A so as to obtain the reliable coverage of the bottom of the via 305A without significantly contributing to the overall line resistance of the combined line 306B and 306A. In other illustrative embodiments, the line segment 306A may represent an upper portion of a via of increased diameter in order to provide superior coverage during the deposition of the barrier layer 307A. Consequently, valuable electro-migration measurement data may be obtained on the basis of a plurality of line segments 306B, wherein the required floor space in the substrate 301 may be reduced.

As a result, the present disclosure relates to a test structure and method of forming the same in order to enhance the reliability and significance of electromigration or other stress-induced migration assessments, which may be compromised in conventional strategies owing to non-uniformities of a barrier material at the respective via bottoms. For this purpose, vias of increased mass flow blocking capabilities are provided next to respective test line segments, thereby effectively decoupling the migration behavior of preceding test structure areas from the behavior of the actual devices under test. In some illustrative embodiments, the enhanced mass flow blocking capability may be achieved by selectively modifying the deposition conditions during the formation of the barrier layer, for instance, by appropriately selecting lateral dimensions of the via and/or the respective trench of the line segment connected thereto. In this case, the deposition technique may provide an increased deposition rate, thereby also providing an increased amount of barrier material at the respective via bottom, which may then efficiently suppress any mass flow through the via during an electromigration test procedure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A chain structure for electromigration tests, comprising:
   a first line segment and a second line segment formed in a first metallization layer located above a semiconducting substrate;
   a first via connected to said first line segment, said first via having a first mass flow blocking capability at a bottom surface of said first via;
   a second via connected to said second line segment, said second via having a second mass flow blocking capability, said first mass flow blocking capability being less than said second mass flow blocking capability; and
   a third line segment formed in a second metallization layer and connected to at least one of said first and second vias.

2. The chain structure of claim 1, wherein said structure further comprises a barrier layer at said bottom surface of said first via and a barrier layer at said bottom surface of said second via and a thickness of said barrier layer at the bottom surface of said first via is less than a thickness of said barrier layer at the bottom surface of said second via.

3. The chain structure of claim 1, wherein a width of said first line segment is less than a width of said second line segment.

4. The chain structure of claim 3, wherein said first width of said first line segment substantially corresponds to a design width of a metal line formed in said first metallization layer of a semiconductor device.

5. The chain structure of claim 3, wherein said first and second vias have substantially the same design dimensions.

6. The chain structure of claim 1, wherein a lateral size of said first via is less than a lateral size of said second via.

7. The chain structure of claim 6, wherein the lateral size of said first via substantially corresponds to a design lateral size of vias of a semiconductor device.

8. The chain structure of claim 6, wherein said first and second line segments have substantially the same width.

9. The chain structure of claim 1, wherein said chain structure comprises a plurality of said first line segments, a plurality of said second line segments and a plurality of said third line segments, each of said first line segments connected to a respective one of said second line segments by a respective one of said third line segments.

10. The chain structure of claim 9, wherein each of said third line segments is connected to one of a first via and one of a second via.

11. A test structure for estimating electromigration effects in a metallization layer of a semiconductor device, the test structure comprising:
    a first line segment having a first width and formed in a first metallization layer;
    a second line segment having a second width greater than said first width, said second line segment formed in said first metallization layer;
    a first via comprising a first barrier layer connected to said first line segment;
    a second via comprising a second barrier layer connected to said second line segment; and
    a third line segment formed in a second metallization layer and connected to at least one of said first and second vias.

12. The test structure of claim 11, wherein at least said first via has design dimensions corresponding to design dimensions of a semiconductor device comprising said first and second metallization layers.

13. The test structure of claim 11, further comprising a plurality of said first line segments having said first width and a plurality of said second line segments having said second width, said plurality of first and second line segments defining a chain structure.

14. The test structure of claim 11, wherein a thickness of said first barrier layer at a bottom surface of said first via is less than a thickness of said second barrier layer at a bottom surface of said second via.

15. The test structure of claim 11, wherein said first and second line segments are directly connected to each other.

* * * * *